(12) United States Patent
Lee

(10) Patent No.: US 9,036,424 B2
(45) Date of Patent: May 19, 2015

(54) MEMORY DEVICE AND METHOD FOR VERIFYING THE SAME

(75) Inventor: Hyung-Min Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 44 days.

(21) Appl. No.: 13/602,952

(22) Filed: Sep. 4, 2012

(65) Prior Publication Data

US 2013/0315003 A1 Nov. 28, 2013

(30) Foreign Application Priority Data

May 25, 2012 (KR) ........................ 10-2012-0056172

(51) Int. Cl.
| G11C 11/34 | (2006.01) |
| G11C 16/34 | (2006.01) |
| G11C 16/06 | (2006.01) |
| G11C 16/24 | (2006.01) |
| G11C 16/26 | (2006.01) |

(52) U.S. Cl.
CPC ............ *G11C 16/3459* (2013.01); *G11C 16/26* (2013.01); *G11C 16/06* (2013.01); *G11C 16/24* (2013.01)

(58) Field of Classification Search
CPC .... G11C 16/3459; G11C 16/24; G11C 16/26; G11C 16/06
USPC ........................... 365/185.22, 185.17, 185.18
See application file for complete search history.

(56) References Cited

U.S. PATENT DOCUMENTS

| 6,049,494 | A | * | 4/2000 | Sakui et al. .................... 365/203 |
| 7,499,332 | B2 | * | 3/2009 | Crippa et al. ............. 365/185.22 |
| 7,512,011 | B2 | * | 3/2009 | Park ......................... 365/185.25 |
| 7,768,827 | B2 | * | 8/2010 | Kang ........................ 365/185.03 |
| 7,848,141 | B2 | * | 12/2010 | Seong et al. ............. 365/185.03 |
| 7,952,935 | B2 | * | 5/2011 | Wang et al. .............. 365/185.21 |
| 8,018,775 | B2 | * | 9/2011 | Oh ........................... 365/185.22 |
| 8,031,530 | B2 | * | 10/2011 | Joo .......................... 365/185.25 |
| 8,059,466 | B2 | * | 11/2011 | Lee et al. .................. 365/185.18 |
| 8,174,903 | B2 | * | 5/2012 | Han et al. ................. 365/185.25 |
| 8,194,464 | B2 | * | 6/2012 | Huh et al. ................. 365/185.22 |
| 8,279,675 | B2 | * | 10/2012 | Lee et al. .................. 365/185.18 |
| 8,305,813 | B2 | * | 11/2012 | Lee ........................... 365/185.21 |
| 8,305,817 | B2 | * | 11/2012 | Park et al. ................. 365/185.22 |
| 8,351,273 | B2 | * | 1/2013 | Lee ........................... 365/185.25 |
| 8,395,940 | B2 | * | 3/2013 | Huh ......................... 365/185.12 |
| 8,462,555 | B2 | * | 6/2013 | Park ......................... 365/185.25 |
| 8,570,801 | B2 | * | 10/2013 | Lim et al. ................. 365/185.03 |
| 8,625,354 | B2 | * | 1/2014 | Cho et al. ................. 365/185.22 |
| 2011/0273935 | A1 | | 11/2011 | Dong et al. |
| 2012/0294093 | A1 | * | 11/2012 | Yang ........................ 365/185.22 |
| 2013/0163331 | A1 | * | 6/2013 | Yoo et al. ................. 365/185.11 |

FOREIGN PATENT DOCUMENTS

KR          101063571          9/2011

* cited by examiner

*Primary Examiner* — Viet Q Nguyen
(74) *Attorney, Agent, or Firm* — IP & T Group LLP

(57) ABSTRACT

A memory includes a cell string including a plurality of memory cells connected in series, a bit line connected to the cell string, a voltage transfer unit configured to electrically connect the bit line and a sensing node in response to a control signal, and a page buffer configured to sense a voltage of the bit line through the sensing node in a sensing period, wherein the page buffer decides a voltage level of the control signal based on a threshold voltage of the target memory cell, which corresponds to a verification target among the plurality of memory cells in the sensing period.

20 Claims, 5 Drawing Sheets

MEMORY DEVICE AND METHOD FOR VERIFYING THE SAME

CROSS-REFERENCE TO RELATED APPLICATIONS

The present application claims priority of Korean Patent Application No. 10-2012-0056172, filed on May 25, 2012, which is incorporated herein by reference in its entirety.

BACKGROUND

1. Field

Exemplary embodiments of the present invention relate to a memory device and a method for verifying the same.

2. Description of the Related Art

A nonvolatile memory is a memory device, which maintains data stored therein, even though power supply is cut off. The nonvolatile memory stores data by using such a property that a threshold voltage of a memory cell is shifted by controlling the amount of charge maintained in a conductive band of a floating gate.

When a program pulse is applied to a floating gate, the threshold voltage of a memory cell rises. Depending on the value of data, which is to be stored in a memory cell using the program pulse, the threshold voltage of the memory cell may differ. However, because a plurality of memory cells in a nonvolatile memory have different characteristics, the threshold voltages of memory cells that stores the same data may not have one value, but form a regular distribution.

Meanwhile, the nonvolatile memory may store one-bit data or multi-bit data in one memory cell. In general, a memory cell that stores one-bit data is referred to as a single level cell (SLC), and a memory cell that stores multi-bit data is referred to as a multi level cell (MLC). The SLC has an erase state and a program state depending on a threshold voltage. The MLC has an erase state and a plurality of program states depending on a threshold voltage.

FIG. 1 is a diagram for illustrating distributions of threshold voltages of MLCs capable of storing two-bit data.

Referring to FIG. 1, the threshold voltages of memory cells differ based on the program states of the memory cells. The threshold voltages of memory cells in an erase state ERA are lower than a first voltage PV1. The threshold voltages of memory cells in a first program state PG1 are higher than the first voltage PV1 and lower than a second voltage PV2. The threshold voltages of memory cells in a second program state PG2 are higher than the second voltage PV2 and lower than a third voltage PV3. The threshold voltages of memory cells in a third program state PG3 are higher than the third voltage PV3. Here, the erase state ERA and the first to third program states PG1 to PG3 indicate that data that have different values are stored in memory cells.

Here, the first to third voltages PV1 to PV3 serve as reference voltages for indicating a state for a memory cell among the possible states that include erase state ERA and first to third program states PG1 to 3. Therefore, when verifying whether or not a memory cell was normally programmed or reading data of a memory cell, the first to third voltages PV1 to PV3 are used.

The verification operation will be described in more detail as follows. When a program operation for a memory cell is performed, a program pulse is applied to a word line corresponding to the memory cell to be programmed, and a verification voltage is then supplied to the word line corresponding to the memory cell to be programmed, in order to verify whether the memory cell is normally programmed or not. The first to third voltages PV1 to PV3 may be used as the verification voltage. As a result of the verification operation, when the memory cell is not normally programmed, a program pulse is further applied to the memory cell, and when the memory cell is normally programmed, the program operation for the memory cell is completed.

MLCs have a plurality of threshold voltage distributions. Therefore, to secure a sufficient read margin when performing a read operation in the respective states ERA and PG1 to PG3, the widths of the threshold voltage distributions based on the respective states need to be reduced. Hereafter, a double verification program for reducing the widths of threshold voltage distributions will be described with reference to FIG. 2.

FIG. 2 is a diagram explaining the double verification program. FIG. 2 illustrates a case where a memory cell is programmed into the first program state PG1 of FIG. 1.

In the case of a general program operation, a verification operation is performed using only the first voltage PV1 as a verification voltage to check whether the memory cell was programmed into the first program state PG1 or not. In the case of a double verification program operation, the threshold voltage of the memory cell is verified one more time by using a first sub voltage DPV1, which is lower than the first voltage PV1, as a sub verification voltage.

The double verification program will be described in more detail as follows. First, a program pulse is applied to a word line that corresponds to a memory cell in an erase state ERA, which is to be programmed. After the program pulse is applied, the first sub voltage DPV1 is used to verify whether the threshold voltage of the memory cell is higher than the first sub voltage DPV1 or not, and the first voltage PV1 is then used to verify whether the threshold voltage of the memory cell is higher than the first voltage PV1 or not. Hereafter, to distinguish a state where program is completed from a state where program is not completed but the threshold voltage of a memory cell is programmed at the first sub voltage DPV1 or more, the former is referred to as a target program state, and the latter is referred to as a sub program state.

For a memory cell that has a lower threshold voltage than the first sub voltage DPV1 as the verification result, a program pulse is applied under the same condition as the previous condition. Furthermore, for a memory cell that has a threshold voltage higher than the first sub voltage DPV1 and lower than the first voltage PV1, that is, a memory cell in the sub program state, the voltage of a bit line is increased, and a program pulse is then applied. For a memory cell that has a higher threshold voltage than the first voltage PV1, that is, a memory cell in the target program state, an inhibit voltage is supplied to the bit line, and a program pulse is then applied.

Similarly, even when a memory cell is programmed into the second program state PG2, a second sub voltage, which is lower than the second voltage PV2 and higher than the first voltage PV1, is used to verify the memory cell two times. However, because the third program state PG3 is located in the rightmost side, the width of the threshold voltage distribution does not need to be reduced. Thus, the double verification program may be not required in the case of the third program state.

In general, when a program pulse is applied, the change in threshold voltage of a memory cell is reduced with the increase in voltage of a bit line. Therefore, in the case of a memory cell that has a threshold voltage, which does not correspond to the sub program state and the target program state, the threshold voltage of the memory cell is significantly changed when a program pulse is applied. In the case of a memory cell in the sub program state, the threshold voltage of the memory cell is changed when a program pulse is applied, but changed less than that of a memory cell in the erase state. In the case of a memory cell in the program state, the threshold voltage of the memory cell is not almost changed even though a program pulse is applied. Therefore, it is possible to reduce the width of the threshold voltage distribution of memory cells in the first program state PG1. In the case of the double verification program, however, two voltages are used to verify whether a memory cell is programmed on program state. Therefore, a time required for performing the verification operation is significantly increased.

SUMMARY

Exemplary embodiments of the present invention is directed to a memory device and a method for verifying the same, which are capable of reducing a verification operation time by verifying one program state using only one verification voltage, even when performing a verification operation included in a double verification program.

In accordance with an exemplary embodiment of the present invention, a memory includes a cell string including a plurality of memory cells connected in series, a bit line connected to the cell string, a voltage transfer unit configured to electrically connect the bit line and a sensing node in response to a control signal, and a page buffer configured to sense a voltage of the bit line through the sensing node in a sensing period, wherein the page buffer decides a voltage level of the control signal based on a threshold voltage of the target memory cell which corresponds to a verification target among the plurality of memory cells in the sensing period.

In accordance with another exemplary embodiment of the present invention, there is provided a method for verifying a memory, which includes a voltage transfer unit configured to electrically connect a bit line and a sensing node of a page buffer in response to a control signal. The method includes precharging the bit line during a first period, changing a voltage of the bit line using a current flowing in a target memory cell in response to a sub verification voltage supplied to a word line corresponding to the target memory cell during an second period, and applying the control signal to the voltage transfer unit, where a voltage level of the control signal is decided on a threshold voltage of the target memory cell, and sensing a voltage of the bit line during a third period.

DETAILED DESCRIPTION

Figure 1:
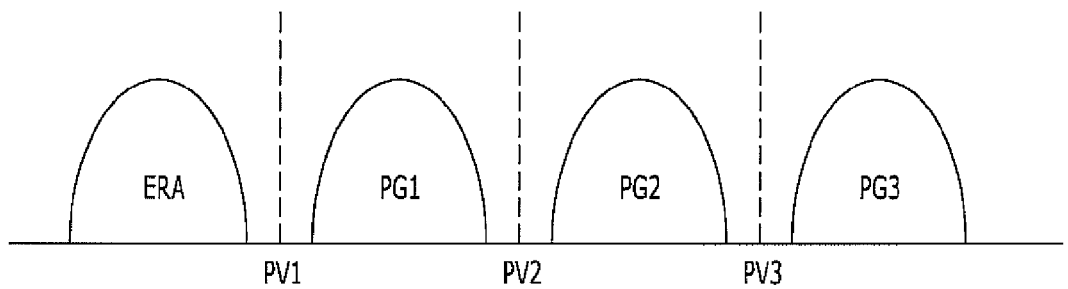
FIG. 1 is a diagram for illustrating distributions of threshold voltages of MLCs capable of storing two-bit data.
Figure 2:
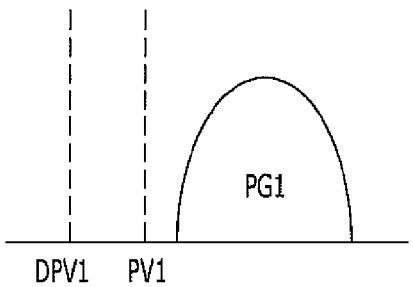
FIG. 2 is a diagram for explaining a double verification program.

Exemplary embodiments of the present invention will be described below in more detail with reference to the accompanying drawings. However, the present invention may be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 3:
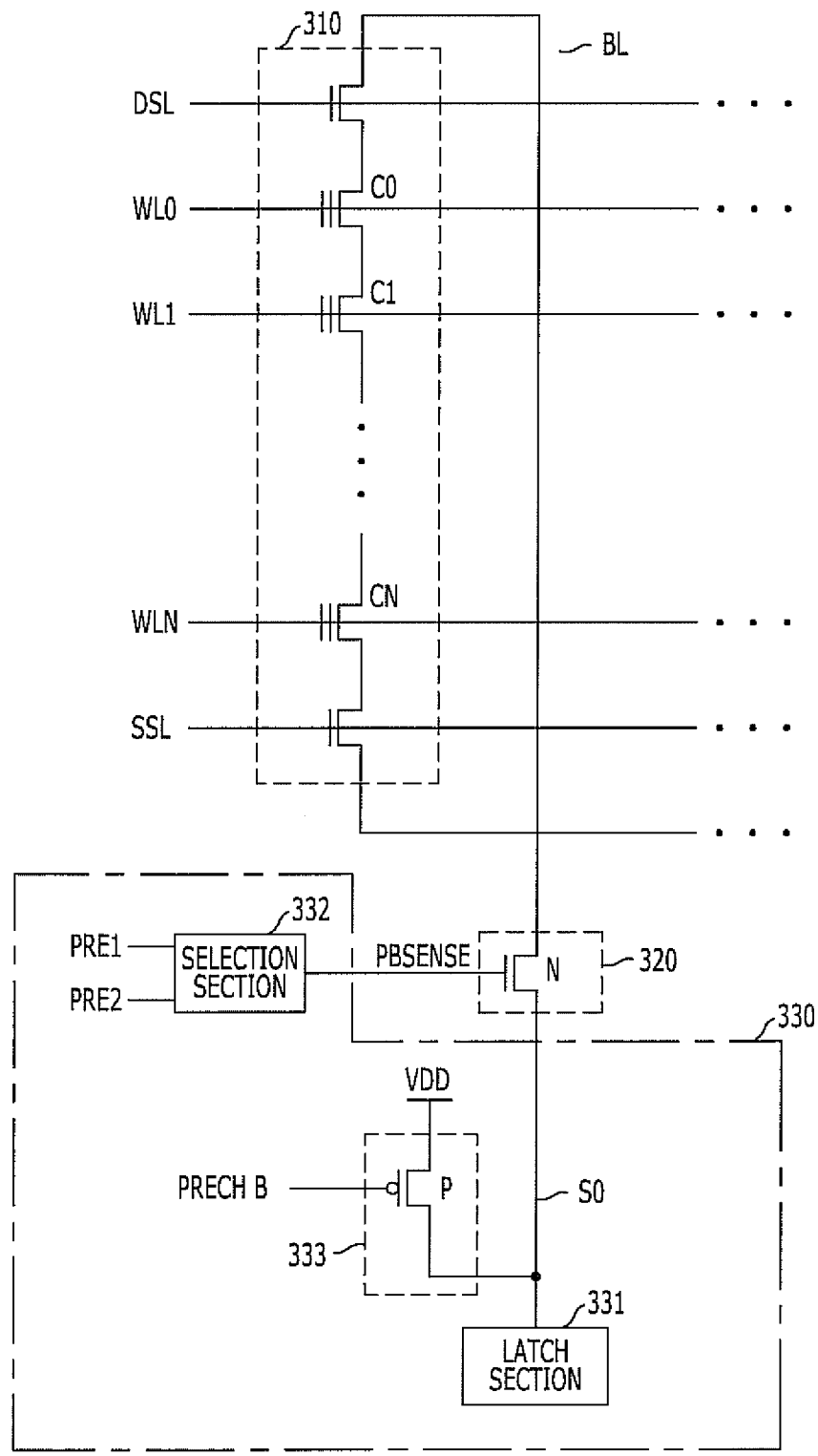
FIG. 3 is a configuration diagram of a memory device in accordance with an embodiment of the present invention.

FIG. 3 is a configuration diagram of a memory device in accordance with an embodiment of the present invention.

Referring to FIG. 3, the memory includes a cell string 310, a bit line BL, a voltage transfer unit 320, and a page buffer 330. The cell string 310 includes a plurality of memory cells C0 to CN connected in series. The bit line BL is connected to the cell string 310. The voltage transfer unit 320 is configured to electrically connect the bit line BL and a sensing node SO in response to a control signal PBSENSE. The page buffer 330 is configured to precharge the sensing node SO in a precharge period and sense the voltage of the bit line BL through the sensing node SO in a sensing period during a verification operation. In the sensing period, the page buffer 330 decides the voltage level of the control signal PBSENSE based on the threshold voltage of a memory cell, which is a verification target among the plurality of memory cells.

The cell string 310 has a string structure in which the plurality of memory cells C0 to CN are connected in series between a source select transistor for receiving SSL and a drain select transistor for receiving DSL. Floating gates of the memory cells C0 to CN receive various voltages through a plurality of word lines WL0 to WLN. The voltage transfer unit 320 may include an NMOS transistor N connected between the bit line BL and the sensing node SO and configured to receive the control signal PBSENSE through a gate thereof.

Referring to FIG. 3, the memory will be described.

Hereafter, a case in which the memory cell C0 (hereafter, referred to as a target cell C0) that corresponds to the word line WL0 is programmed into the first program state PG1 through the above-described double verification program is taken as an example of description.

When a program operation is started, a program pulse is applied to the target cell C0, which is subsequently programmed and verified. The program pulse may be applied through an increment step pulse program (ISPP) method. Because the ISPP method is well known to those in the art to which the present invention pertains, the descriptions thereof are omitted herein. In order to determine whether or not the target cell C0 was normally programmed after the program pulse is applied, a verification operation is performed.

The verification operation is performed through a precharge period, an evaluation period, and a sensing period. The precharge period is used for the page buffer 330 to precharge the bit line BL that corresponds to the target cell C0 through the sensing node SO. The evaluation period is the period that the voltage of the bit line BL is changed by a current flowing in the target cell C0 in response to the word line WL0 that corresponds to the target cell C0. The sensing period is the period that the page buffer 330 senses the voltage of the bit line BL, which is decided in the evaluation period, and stores the state of the target cell C0.

In the case of the double verification program, the state of the target cell C0 is verified by using two verification voltages for each of the program states. A sub verification voltage DPV1 is a verification voltage for verifying whether the target cell C0 was sub-programmed or not, and a target verification voltage PV1 is a verification voltage for verifying whether the target cell C0 was programmed or not. In the case of the double verification program, the target cell C0 has one state among a non-program state that corresponds to an erase state ERA, a sub program state, and a program state.

In the non-program state where the target cell C0 is not programmed at all, the threshold voltage of the target cell C0 is lower than the sub verification voltage DPV1. In the sub program state, where the target cell C0 is sub-programmed, the threshold voltage of the target cell C0 is higher than the sub verification voltage DPV1 and lower than the target verification voltage PV1. In the target program state where the target cell C0 is completely programmed, the target voltage of the target cell C0 is higher than the target verification voltage PV1. For a memory cell in the sub program state, a higher voltage is supplied to the bit line than a voltage of a memory cell in the non-program state, when a program pulse is applied as described above.

Hereafter, the respective periods of the verification operation will be described in detail.

In the precharge period, the page buffer 330 precharges the sensing node SO to a power supply voltage VDD. The voltage transfer unit 330 electrically connects the sensing node SO and the bit line BL in response to the control signal PBSENSE, and the bit line BL is precharged. Depending on the voltage level of the control signal PBSENSE supplied to the voltage transfer unit 320 in the precharge period, a level to which the bit line BL is precharged may differ. Hereafter, the level of the control signal PBSENSE in the precharge period is referred to as a precharge level VP.

In the evaluation period, the control signal PBSENSE is deactivated, and the bit line BL and the sensing node SO are electrically disconnected. During the verification operation, the sub verification voltage DPV1 is supplied to the target cell C0, and a voltage for turning on the drain select transistor and the source select transistor to cause a current to flow into the target cell C0 is supplied to the other memory cells C1 to CN, the drain select transistor, and the source select transistor. Therefore, during the evaluation period, a current is passed through the target cell C0 in response to the sub verification voltage DVP1. At this time, the voltage of the bit line BL differs depending on the amount of current flowing in the target cell C0.

In the sensing period, the control signal PBSENSE that has a different voltage level from the precharge period is supplied to the voltage transfer unit 320. The voltage transfer unit 320 electrically connects the bit line BL and the sensing node SO in response to the PBSENSE. When the bit line BL and the sensing node SO are electrically connected, the page buffer 330 senses the voltage of the bit line BL through the sensing node SO and stores the state of the target cell C0 among the non-program state, the sub program state, and the target program state.

The page buffer 330 in accordance with the embodiment of the present invention decides the voltage level of the control signal PBSENSE in the sensing period based on the threshold voltage of the target cell C0. More specifically, the page buffer 330 decides the voltage level of the control signal PBSENSE as a first level V1 if the threshold voltage of the target cell C0 is lower than the sub verification voltage DPV1, and decides the voltage level of the control signal PBSENSE as a second level V2, which is higher than the first level V1, if the threshold voltage of the target cell C0 is higher than the sub verification voltage DPV1.

Before program is started, the target cell C0 stays in the non-program state. Therefore, in the case of a verification operation which is first performed after the program pulse is applied, the state of the target cell C0 is stored as the non-program state in the page buffer 330. Because the threshold voltage of the target cell C0 in the non-program state is lower than the sub verification voltage DPV1, the page buffer 330 decides the voltage level of the control signal PBSENSE as the first level V1. When the verification operation is completed, the state of the target cell C0, which is decided between the non-program state and the sub program state based on the verification result, is stored in the page buffer 330.

Furthermore, when a verification operation is performed after the next program pulse is applied, the voltage level of the control signal PBSENSE is decided based on the state of the target cell C0, which is stored in the page buffer 330 as the previous verification operation result, that is, the threshold voltage of the target C0. The page buffer 330 decides the voltage level of the control signal PBSENSE as the first level V1 if the target cell C0 is in the non-program state, and decides the voltage level of the control signal PBSENSE as the second level V2 if the target cell C0 is in the sub program state. If the control signal PBSENSE at the first level V1 is applied to the voltage transfer unit 320, the operation of the memory device is performed in the same manner as described above.

When the second signal PBSENSE at the second level V2 is applied to the voltage transfer unit 320, the state of the target cell C0 is decided between the sub program state and the target program state based on the voltage of the bit line BL which is sensed through the sensing node SO in the sensing period. When the verification operation is completed, the state of the target cell C0 is stored in the page buffer 330. When the target cell C0 is in the target program state, an inhibit voltage is supplied to the bit line BL at the time of applying the next program pulse. Then, the threshold voltage of the target cell C0 is not changed.

For the above-described operation, the page buffer 330 includes a latch unit 331, a selection unit 332, and a precharge unit 333. The latch unit 331 is configured to store the state of the target cell C0, which is decided among the non-program state, the sub program state, and the program state. The selection unit 332 is configured to receive a first pre-signal PRE1 that has the first level V1 in the sensing period and a second pre-signal PRE2 that has the second level V2 in the sensing period, select the first pre-signal PRE1 as the control signal PBSENSE if the target cell C0 is in the non-program state based on the value stored in the latch unit 331, and select the second pre-signal PRE2 as the control signal PBSENSE if the target cell C0 is in the sub program state. The precharge unit 333 is configured to precharge the sensing node SO in the precharge period.

The precharge unit 333 precharges the sensing node SO to the power supply voltage VDD in response to a precharge signal PRECHB, which is activated to a low level in the precharge period. The precharge unit 333 may include a PMOS transistor connected between the power supply voltage terminal VDD and the sensing node SO and configured to receive the precharge signal PRECHB through a gate thereof.

The selection unit 332 receives the first pre-signal PRE1 and the second pre-signal PREZ. The voltage levels of the first and second pre-signals PRE1 and PRE2 are equal to the precharge level VP in the precharge period and equal to a ground voltage level VSS in the evaluation period. In the sensing period, the first and second pre-signals PRE1 and PRE2 have different levels. That is, the first pre-signal PRE1 has the first level V1, and the second pre-signal PRE2 has the second level V2. The selection unit 332 selects the first pre-signal PRE1 as the control signal PBSENSE if the target cell C0 is in the non-program state based on the value stored in the latch unit 331, and selects the second pre-signal PRE2 as the control signal PBSENSE if the target cell C0 is in the sub program state.

At first, the latch unit 331 stores the state of the target cell C0 as the non-program state. Then, the latch unit 331 updates the state of the target cell C0 into any one of the non-program state, the sub program state, and the target program state based on the verification result. Furthermore, the latch unit 331 transfers the value stored therein to the selection unit 332.

In accordance with the embodiment of the present invention, the voltage level of the control signal PBSENSE may be differently set in the sensing period, depending on the threshold voltage of the target cell C0, that is, the state of the target cell C0. Accordingly, only the sub verification voltage DPV1 may be used to verify the target cell C0. Therefore, it is possible to reduce the verification operation time more compared to an operation in which a verification operation is performed by sequentially supplying the sub verification voltage DPV1 and the target verification voltage PV1 to the world line WL0 corresponding to the target cell C0. The reason why only the sub verification voltage DPV1 may be used to verify a state for the target cell C0 among the possible states that include non-program state, the sub program state, and the target program state will be described below with reference to FIG. 4.

In FIG. 3, the case where the specific target cell C0 is programmed in the specific program state PG1 has been taken as an example for description, but the present invention is not limited thereto. Among the plurality of memory cells C0 to Cn belonging to the cell string 310, any memory cell may be set to the target cell. Even when the target cell is programmed into another program state PG2 or PG3 instead of the first program state, only the levels of the sub verification voltage and the target verification voltage are changed, and the verification operation may be performed in the same manner as described above to verify a state for the target cell C0 among the possible states that include the non-program state, sub program state, and the program state. For reference, the memory in accordance with the embodiment of the present invention may include a nonvolatile memory, for example, a NAND flash memory.

Figure 4:
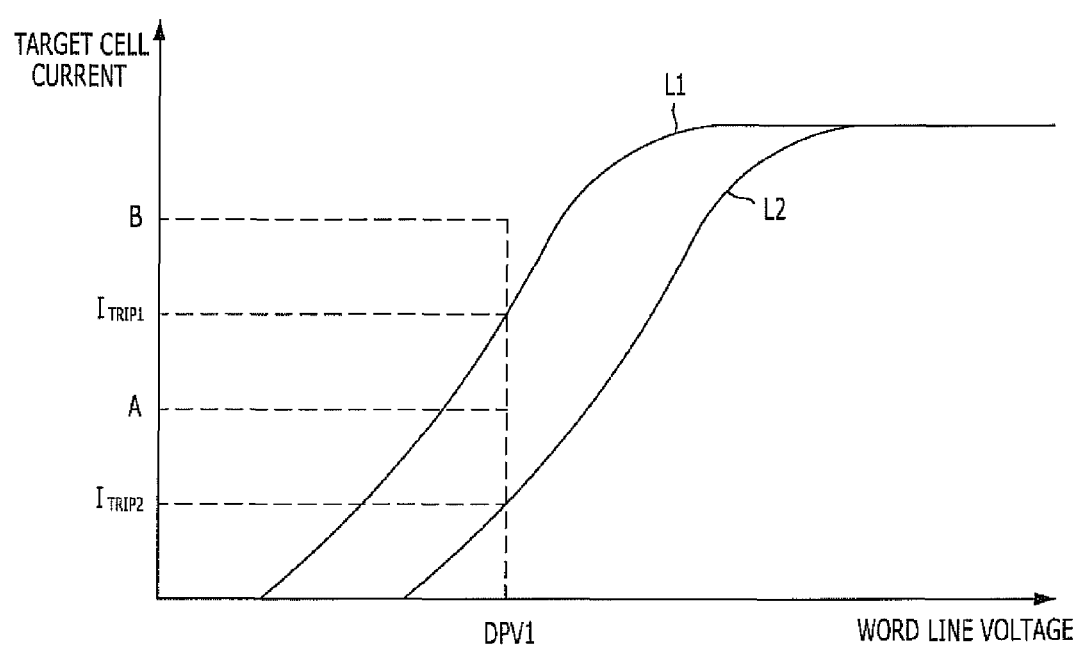
FIG. 4 is a graph illustrating the relationship between a voltage supplied to a word line and a current flowing in a target cell during a verification operation.

FIG. 4 is a graph illustrating the relationship between a voltage supplied to a word line and a current flowing in a target cell C0 during a verification operation.

A first curve L1 indicates a current flowing in a target cell C0 depending on a voltage supplied to a word line, the target cell C0 that has a threshold voltage equal to the sub verification voltage DPV1. A second curve L2 indicates a current flowing in a target cell C0 depending on a voltage supplied to a word line, and the target cell C0 that has a threshold voltage is equal to the target verification voltage PV1. Hereafter, the curves are referred to as characteristic curves.

For reference, the current flowing in the target cell C0 is decided based on the threshold voltage of the target cell C0. As the threshold voltage of the target cell C0 increases, the current flowing in the target cell C0 decreases. Therefore, as the threshold voltage of the target cell C0 increases, the curve indicating the current flowing in the target cell C0 during the verification operation is gradually shifted toward the right side of the graph.

The page buffer 330 recognizes the target cell C0 as one of two states (programmed state and unprogrammed state) based on the logic level of the voltage of the bit line BL, which is sensed through the sensing node SO during the verification operation. That is, the state of the target cell C0 is divided into the programmed state and the unprogrammed state, depending on whether the voltage of the bit line BL sensed through the sensing node SO is high or low.

In the exemplary embodiment of the present invention, however, the state of the target cell C0 is recognized as one of three states, that is, the non-program state, the sub program state, and the target program state, while only the sub verification voltage DPV1 is supplied to the target cell C0. If the voltage level of the control signal PBSENSE is controlled in the sensing period as described above with reference to FIG. 3, the state of the target cell C0 may be recognized as one of the three states, and the reason may be explained as follows.

The operation principle of the memory in accordance with the exemplary embodiment of the present invention will be described using the concept of a reference current $I_{TRIP}$. The reference current $I_{TRIP}$ performs a decision regarding whether the target cell C0 is programmed or not. When a higher current than the reference current $I_{TRIP}$ flows in the target cell C0 after a verification voltage that has a specific level is supplied to the word line WL0 that corresponds to the target cell C0, the page buffer 330 recognizes that the target cell C0 is not programmed. When a lower current than the reference current $I_{TRIP}$ flows in the target cell C0, the page buffer 330 recognizes that the target cell C0 is programmed.

The value of the reference current $I_{TRIP}$ may be set based on an equation expressed by $I_{TRIP} = C_{BL} \times (V_{PRECH} - V_{SENSE}) \div tEVAL$. Here, $C_{BL}$ represents the capacitance value of the bit line BL, $V_{PRECH}$ represents the voltage of the control signal PBSENSE in the precharge period, $V_{SENSE}$ represents the voltage of the control signal PBSENSE in the sensing period, and tEVAL represents the size (time) of the evaluation period. Depending on the reference current $I_{TRIP}$ set in such a manner, the threshold voltage of the target cell C0, at which the page buffer 330 recognizes the target cell C0 to be programmed, may differ.

For example, it may be assumed that, when the sub verification voltage DPV1 is supplied to the word line that corresponds to the target cell C0, the value of the reference current $I_{TRIP}$ is set to A. In this case, if the voltage of the word line corresponds to the sub verification voltage DPV1, a current flowing in a memory cell that has the characteristic of the first curve L1 is larger than A. Therefore, the page buffer 330 recognizes that the memory cell is not programmed. On the other hand, if the voltage of the word line corresponds to the sub verification voltage DPV1, a current flowing in a memory cell that has the characteristic of the second curve L2 is smaller than A. Therefore, the page buffer 330 recognizes that the memory cell is programmed.

As another example, it may be assumed that, when the sub verification voltage DPV1 is supplied to the word line that corresponds to the target cell C0, the value of the reference current $I_{TRIP}$ is set to B. In this case, when the voltage of the word line corresponds to the sub verification voltage DPV1, currents flowing in the memory cell that has the characteristic of the first curve L1 and the memory cell that has the characteristic of the second curve L2 are smaller than B. Therefore, the page buffer 330 recognizes that both of the memory cells are programmed.

That is, although the same verification voltage is supplied to the word line, the page buffer 330 may recognize that a memory cell is programmed or unprogrammed, depending on how the reference current $I_{TRIP}$ is set.

Suppose that if the voltage level of the control signal PBSENSE in the sensing period corresponds to the first level V1, the reference current is referred to as a first reference current $I_{TRIP1}$, and if the voltage level of the control signal PBSENSE in the sensing period corresponds to the second level V2, the reference current is referred to as a second reference current $I_{TRIP2}$. In this case, the value of the first reference current $I_{TRIM}$ becomes $C_{BL} \times (VP-V1) \div tEVAL$, the value of the second reference current $I_{TRIP2}$ becomes $C_{BL} \times (VP-V2) \div tEVAL$. Because the second level V2 is larger than the first level V1, the second reference current $I_{TRIP2}$ is smaller than the first reference current $I_{TRIP1}$.

Here, when a voltage supplied to the word line that corresponds to the target cell C0 during the verification operation is the sub verification voltage DPV1, the value of the first reference current $I_{TRIP1}$ is set in such a manner that a current flowing in the target cell C0, which has a threshold voltage equal to the sub verification voltage DPV1, becomes the first reference current $I_{TRIP1}$. Furthermore, when the voltage supplied to the word line that corresponds to the target cell C0 during the verification operation is the sub verification voltage DPV1, the value of the second reference current $I_{TRIP2}$ is set in such a manner that a current flowing in the target cell C0, which has a threshold voltage equal to the target verification voltage PV1, becomes the second reference current $I_{TRIP2}$.

According to the first reference current $I_{TRIP1}$, the page buffer 330 recognizes that a memory cell that has a threshold voltage larger than the sub verification voltage DPV1 is programmed and a memory cell that has a lower threshold voltage is not programmed. The memory cell that has a threshold voltage larger than the sub verification voltage DPV1 may include a memory cell in which a current flowing therein is lower than the first reference current $I_{TRIP1}$, when the sub verification voltage DPV1 is supplied to the word line. Meanwhile, based on the second reference current $I_{TRIP2}$, the page buffer 330 recognizes that a memory cell that has a threshold voltage larger than the target verification voltage PV1 is programmed and a memory cell that has a lower threshold voltage is not programmed. The memory cell that has a threshold voltage larger than the target verification voltage PV1 may include a memory cell in which a current flowing therein is lower than the second reference current $I_{TRIP2}$, when the sub verification voltage DPV1 is supplied to the word line.

From all these considerations, the present invention will be described as follows. First, when the state of the target cell C0 is stored as the non-program state in the page buffer 330, the control signal PBSENSE that has the first level V1 is supplied to the voltage transfer unit 320 (the reference voltage is set to the first reference current $I_{TRIP1}$). Therefore, as the verification result, when the page buffer 330 recognizes that the target cell C0 is programmed, the target cell C0 is in the sub program state. On the other hand, as the verification result, when the page buffer 330 recognizes that the target cell C0 is not programmed, the target cell C0 is still in the non-program state.

Next, when the state of the target cell C0 is stored as the sub-program state in the page buffer 330, the control signal PBSENSE that has the second level V2 is supplied to the voltage transfer unit 320 (the reference voltage is set to the second reference current $I_{TRIP2}$, which is lower than the first reference current $I_{TRIP1}$). Therefore, as the verification result, when the page buffer 330 recognizes that the target cell C0 is programmed, the target cell C0 is in the target program state. On the other hand, as the verification result, when the page buffer 330 recognizes that the target cell C0 is not programmed, the target cell C0 is still in the sub program state.

In other words, first, the reference current is set to the first reference current $I_{TRIP1}$, and whether the target cell C0 was programmed or not is determined and stored. Then, when the target cell C0 is in the sub program state, the reference current is set to the second reference current $I_{TRIP2}$, and whether the target cell C0 was programmed or not is determined and stored. Accordingly, although only the sub verification voltage DPV1 is supplied to the word line, it is possible to determine to which state the target cell C0 that corresponds among the non-program state, the sub program state, and the target program state. Such a principle may be applied in the same manner, even when the target cell C0 is programmed into another program state instead of the first program state PG1.

Figure 5:
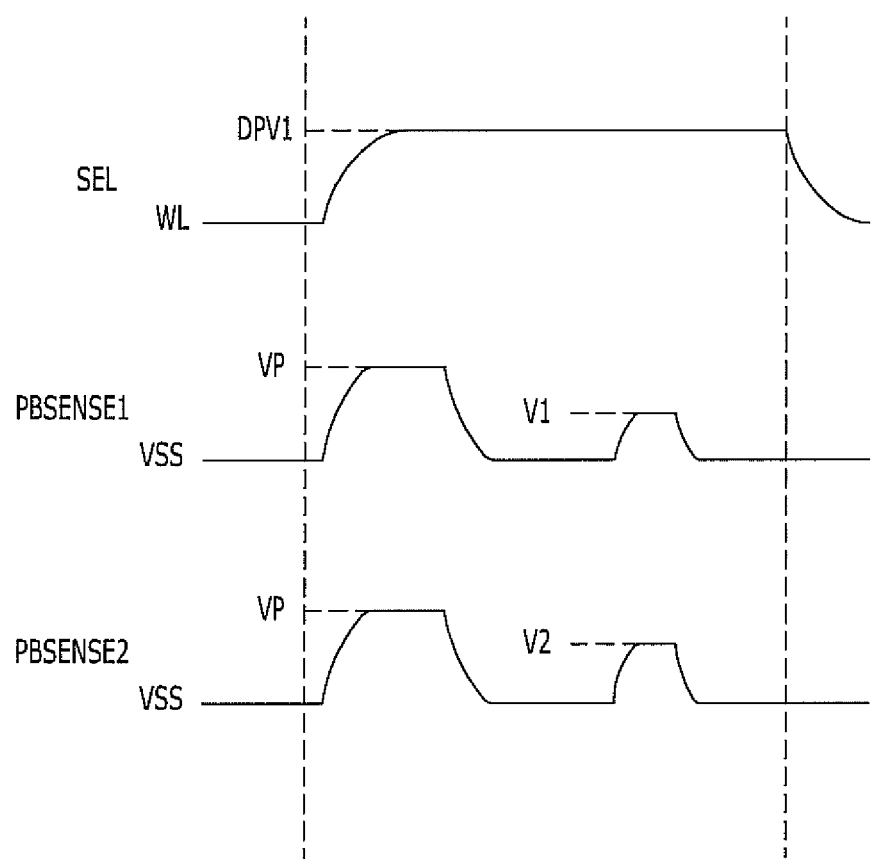
FIG. 5 is a waveform diagram for explaining the operation of the memory of FIG. 3.

FIG. 5 is a waveform diagram for explaining the operation of the memory of FIG. 3.

FIG. 5 illustrates the waveform WL of a voltage supplied to the word line that corresponds to the target cell C0 and the waveforms PBSENSE1 and PBSENSE2 of the control signal.

PBSENSE1 represents a waveform of the control signal when the state of the target cell C0 is stored as the non-program state in the page buffer 330. PBSENSE2 represents a waveform of the control signal when the state of the target cell C0 is stored as the sub program state in the page buffer 330.

In the precharge period T1, the control signals PBSENSE1 and PBSENSE2 are activated to the precharge level VP, regardless of the state of the target cell C0 stored in the page buffer 330. In the evaluation period T2, the control signals PBSENSE1 and PBSENSE2 are deactivated to the ground voltage level VSS, regardless of the state of the target cell C0 stored in the page buffer 330.

In the sensing period T3, when the state of the target cell C0 is stored as the non-program state in the page buffer 330, the control signal PBSENSE1 that has the first level V1 is supplied, and when the state of the target cell C0 is stored as the sub program state in the page buffer 330, the control signal PBSENSE2 that has the second level V2 is supplied.

For reference, while the verification operation is performed as described above, the sub verification voltage DPV1 is supplied to the word line WL0 that corresponds to the target cell C0.

Figure 6:
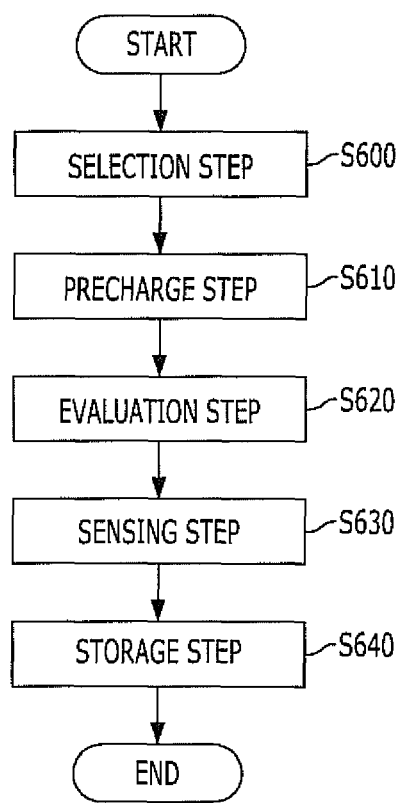
FIG. 6 is a flow chart for explaining a method for verifying a memory in accordance with another embodiment of the present invention.

FIG. 6 is a flow chart for explaining a method for verifying a memory device in accordance with another embodiment of the present invention. Hereafter, referring to FIGS. 3 and 6, the method for verifying a memory device in accordance with the embodiment of the present invention will be described.

Referring to FIG. 6, the method for verifying a memory device including a voltage transfer unit 320 configured to electrically connect a bit line BL and a sensing node SO of a page buffer 330 in response to a control signal PBSENSE includes precharging the bit line BL during a first period T1 (hereafter, referred to as a precharge step S610), changing the voltage of the bit line BL using a current flowing in a target memory cell C0 (target cell C0) during an second period T2, in response to a sub verification voltage DPV1 supplied to a word line WL0 that corresponds to the target cell C0 (hereinafter referred to as an evaluation step S620), and applying the control signal PBSENSE to the voltage transfer unit 320, where the voltage level is decided based on the threshold voltage of the target cell C0, and sensing the voltage of the bit line BL during a third period T3 (hereinafter referred to as a sensing period S630). Here, the first period T1 is a precharge period T1, the second period T2 is an evaluation period T2 and the third period T3 is a sensing period.

The method for verifying a memory device may further include receiving a first pre-signal PRE1 that has a first level V1 during the sensing period T3 and a second pre-signal PRE2 that has a second level V2 during the sensing period T3, selecting the first pre-signal PRE1 as the control signal PBSENSE when the target cell C0 is in a non-program state, and selecting the second pre-signal PRE2 as the control signal PBSENSE when the target cell C0 is a sub program state (hereinafter referred to as a selection step S600), and storing the state of the target cell C0, which is decided among the non-program state, the sub program state, and the program state, based on the voltage of the bit line BL sensed through the sensing node SO at the sensing step S630 (hereafter, referred to as a storage step S640).

The method for verifying a memory device in accordance with the embodiment of the present invention may be included in the double verification program. Because the double verification program has been described above with reference to FIGS. 1 to 5, the following descriptions will be focused on a verification operation.

At the selection step S600, one of the first and second pre-signals PRE1 and PRE2 is selected as the control signal PBSENSE based on the state of the target cell C0 stored in the page buffer 330 before the control signal PBSENSE is applied for the verification operation. During the sensing period T3, the voltage level of the first pre-signal PRE1 is the first level V1, and the voltage level of the second pre-signal PRE2 is the second level V2. If the target cell C0 is in the non-program state, the first pre-signal PRE1 is selected as the control signal PRSENSE, and if the target cell C0 is in the sub program state, the second pre-signal PRE2 is selected as the control signal PBSENSE.

At the precharge step S610, the bit line BL is precharged by the page buffer 330 during the precharge period T1. At the evaluation step S620, the voltage of the bit line BL is changed by a current flowing in the target cell C0 to which the sub verification voltage DPV1 is supplied.

At the sensing step S630, the page buffer 330 senses the voltage of the bit line BL through the sensing node SO, which is electrically connected to the bit line BL by the voltage transfer unit 320, during the sensing period T3. At this time, as described above with reference to FIG. 3, when the state of the target cell C0 stored in the page buffer 330 corresponds to the non-program state, the control signal PBSENE that has the first level V1 is applied to the voltage transfer unit 320, and when the state of the target cell C0, which is stored in the page buffer 330 corresponds to the sub program state, the control signal PBSENSE that has the second level V2 is applied to the voltage transfer unit 320. At this time, when a verification operation has not been performed previously, the state of the target cell C0 is stored as the non-program state in the page buffer 330.

At the storage step S640, the state of the target cell C0 is stored. The state of the target cell C0 is decided among the non-program state, the sub program state, and the program state based on the voltage of the bit line BL sensed through the sensing node SO at the sensing step S630. Here, the non-program state, the sub program state, and the program state are the same as described above with reference to FIGS. 3 and 4.

For reference, until the target cell C0 is completely programmed, the process of applying a program pulse and verifying the target cell is repeated. FIG. 6 shows only one verification operation.

In the method for verifying a memory device in accordance with the embodiment of the present invention, the voltage level of the control signal PBSENSE, which is supplied to the voltage transfer unit 320 at the sensing step S630, may be set differently depending on the threshold voltage of the target cell C0. Therefore, although only the sub verification voltage DPV1 is supplied to the world line that corresponds to the target cell C0, it is possible to distinguish the state the target cell C0 corresponds among the non-program state, the sub program state, and the target program state. Therefore, because two kinds of voltages do not need to be supplied to the word line that corresponds to the target cell C0 unlike the conventional method, it is possible to significantly reduce the verification operation time.

In accordance with the exemplary embodiments of the present invention, even when a verification operation, which is included in the double verification program is performed, one program state may be verified by using only one verification voltage. Therefore, it is possible to reduce the verification operation time.

While the present invention has been described with respect to the specific embodiments, it will be apparent to those skilled in the art that various changes and modifications may be made without departing from the spirit and scope of the invention as defined in the following claims.

What is claimed is:
1. A memory device comprising:
a cell string comprising a plurality of memory cells connected in series;
a bit line connected to the cell string;
a voltage transfer unit configured to electrically connect the bit line and a sensing node in response to a control signal; and
a page buffer configured to sense a voltage of the bit line through the sensing node in a sensing period,
wherein the page buffer decides a voltage level of the control signal based on a threshold voltage of the target memory cell which corresponds to a verification target among the plurality of memory cells in the sensing period.

2. The memory device of claim 1, wherein the page buffer decides the voltage level of the control signal as a first level if the threshold voltage of the target memory cell is lower than a sub verification voltage, and decides the voltage level of the control signal as a second level higher than the first level if the threshold voltage of the target memory cell is higher than the sub verification voltage.

3. The memory of claim 2, wherein, if the threshold voltage of the target memory cell is lower than the sub verification voltage, the target memory cell is in a non-program state,
if the threshold voltage of the target memory cell is higher than the sub verification voltage and lower than a target verification voltage that is higher than the sub verification voltage, the target memory cell is in a sub program state, and
if the threshold voltage of the target memory cell is higher than the target verification voltage, the target memory cell is in a target program state.

4. The memory device of claim 3, wherein the page buffer comprises:
a latch unit configured to store the state of the target memory cell among the non-program state, the sub program state, and the target program state; and
a selection unit configured to receive a first pre-signal having the first level in the sensing period and a second pre-signal having the second level in the sensing period, to select the first pre-signal as the control signal when the target memory cell is in the non-program state based on the value stored in the latch unit, and to select the second pre-signal as the control signal if the target memory cell is in the sub program state.

5. The memory device of claim 4, wherein the page buffer configure to precharge the sensing node in a precharge period.

6. The memory device of claim 5, wherein the page buffer further comprises a precharge unit configured to precharge the sensing node in the precharge period.

7. The memory device of claim 4, wherein if a verification operation has not been performed previously, the state of the target memory cell is stored as the non-program state in the latch unit.

8. The memory device of claim 3, wherein if the target memory cell is in the target program state, the target memory cell is completely programmed.

9. The memory device of claim 3, wherein, during the verification operation, the sub verification voltage is supplied to a word line corresponding to the target memory cell.

10. The memory device of claim 3, wherein the verification operation is included in a double verification program operation.

11. A method for verifying a memory device which includes a voltage transfer unit configured to electrically connect a bit line and a sensing node of a page buffer in response to a control signal, the method comprising:
   precharging the bit line during a first period;
   changing a voltage of the bit line using a current flowing in a target memory cell in response to a sub verification voltage supplied to a word line corresponding to the target memory cell during a second period; and
   applying the control signal to the voltage transfer unit, where a voltage level of the control signal is decided based on a threshold voltage of the target memory cell, and sensing a voltage of the bit line during a third period.

12. The method of claim 11, wherein the first period is a precharge period, the second period is an evaluation period and the third period is a sensing period.

13. The method of claim 12, wherein, in the applying of the control signal,
   if the threshold voltage of the target memory cell is lower than the sub verification voltage, the voltage level of the control signal is decided as a first level, and
   if the threshold voltage of the target memory cell is higher than the sub verification voltage, the voltage level of the control signal is decided as a second level that is higher than the first level.

14. The memory of claim 13, wherein, if the threshold voltage of the target memory cell is lower than the sub verification voltage, the target memory cell is in a non-program state,
   if the threshold voltage of the target memory cell is higher than the sub verification voltage and lower than a target verification voltage that is higher than the sub verification voltage, the target memory cell is in a sub program state, and
   if the threshold voltage of the target memory cell is higher than the target verification voltage, the target memory cell is in a target program state.

15. The memory of claim 14, further comprising:
   receiving a first pre-signal having the first level in the sensing period and a second pre-signal having the second level in the sensing period;
   selecting the first pre-signal as the control signal if the target memory cell is in the non-program state; and
   selecting the second pre-signal as the control signal if the target memory cell is in the sub program state.

16. The memory of claim 15, further comprising storing the state of the target memory cell among the non-program state, the sub program state, and the program state based on the voltage of the bit line, which is sensed through the sensing node in applying the control signal.

17. The memory of claim 14, wherein, if a verification operation has not been performed previously, the state of the target memory cell is stored as the non-program state in the page buffer.

18. The memory of claim 14, wherein, if the target memory cell is in the target program state, the target memory cell is completely programmed.

19. A memory device comprising:
   a cell string comprising a plurality of memory cells connected in series;
   a bit line connected to the cell string;
   a voltage transfer unit configured to electrically connect the bit line and a sensing node in response to a control signal; and
   a page buffer configured to sense a voltage of the bit line through the sensing node in a sensing period,
   wherein the page buffer decides a voltage level of the control signal based on a state of a target memory cell which corresponds to a verification target among the plurality of memory cells in the sensing period.

20. The memory device of claim 1, wherein the page buffer decides the voltage level of the control signal as a first level if the state of the target memory cell is a non-program state, and decides the voltage level of the control signal as a second level higher than the first level if the state of the target memory cell is a sub program state.

* * * * *